(12) United States Patent
Migita et al.

(10) Patent No.: US 8,703,600 B2
(45) Date of Patent: Apr. 22, 2014

(54) ELECTRONIC COMPONENT AND METHOD OF CONNECTING WITH MULTI-PROFILE BUMPS

(75) Inventors: Tatsuo Migita, Kanagawa (JP); Hirokazu Ezawa, Tokyo (JP); Soichi Yamashita, Kanagawa (JP); Takashi Togasaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 725 days.

(21) Appl. No.: 12/721,741

(22) Filed: Mar. 11, 2010

(65) Prior Publication Data
US 2010/0301472 A1 Dec. 2, 2010

(30) Foreign Application Priority Data
Jun. 2, 2009 (JP) ................................. 2009-133400

(51) Int. Cl.
*H01L 21/00* (2006.01)
*H01L 21/44* (2006.01)

(52) U.S. Cl.
USPC ............................ 438/613; 438/108; 438/612

(58) Field of Classification Search
USPC ......................................... 438/108, 109, 613
See application file for complete search history.

(56) References Cited

U.S. PATENT DOCUMENTS

| | | | |
|---|---|---|---|
| 5,796,169 A * | 8/1998 | Dockerty et al. | 257/780 |
| 5,828,128 A * | 10/1998 | Higashiguchi et al. | 257/738 |
| 6,107,685 A * | 8/2000 | Nishiyama | 257/737 |
| 6,339,254 B1 * | 1/2002 | Venkateshwaran et al. | 257/686 |
| 6,372,622 B1 * | 4/2002 | Tan et al. | 438/612 |
| 6,534,875 B1 * | 3/2003 | Nishiyama | 257/778 |
| 6,825,568 B2 * | 11/2004 | Hung | 257/778 |
| 7,180,183 B2 * | 2/2007 | Tsai et al. | 257/737 |
| 7,193,157 B2 * | 3/2007 | Matsuda et al. | 174/254 |
| 7,598,621 B2 * | 10/2009 | Yashiro | 257/786 |
| 7,768,125 B2 * | 8/2010 | Chow et al. | 257/738 |
| 7,825,022 B2 * | 11/2010 | Nalla et al. | 438/612 |
| 7,863,098 B2 * | 1/2011 | Lange et al. | 438/108 |

(Continued)

FOREIGN PATENT DOCUMENTS

| | | |
|---|---|---|
| JP | 50-119568 | 9/1975 |
| JP | 08-274102 | 10/1996 |

(Continued)

OTHER PUBLICATIONS

Japanese Office Action for Japanese Application No. 2009-133400 mailed on Oct. 30, 2012.

(Continued)

*Primary Examiner* — James Mitchell
(74) *Attorney, Agent, or Firm* — White & Case LLP

(57) ABSTRACT

An electronic component in which an element is formed on a chip includes: a pad that is made of a conductive material and that is formed in a first bump formation region that is two-dimensionally arranged in center of one principle face and in a second bump formation region that is linearly arranged at peripheral border of the principle face; a passivation film that is formed on the principle face to cover portion except a formation position of the pad; a metal layer that is formed on the pad; and a bump that is made of a conductive material and that is formed on the metal layer by plating, wherein radius of the metal layer in the second bump formation region is smaller than radius of at least some of the metal layer in the first bump formation region.

5 Claims, 6 Drawing Sheets

(56) References Cited

U.S. PATENT DOCUMENTS

| | | | |
|---|---|---|---|
| 7,951,699 B2 * | 5/2011 | Iwasaki et al. | 438/613 |
| 8,067,950 B2 * | 11/2011 | Nagai et al. | 324/750.3 |
| 2002/0070438 A1 * | 6/2002 | Ference et al. | 257/685 |
| 2003/0022477 A1 * | 1/2003 | Hsieh et al. | 438/612 |
| 2004/0094837 A1 * | 5/2004 | Greer | 257/737 |
| 2005/0116326 A1 * | 6/2005 | Haba et al. | 257/678 |
| 2005/0233571 A1 * | 10/2005 | Tao et al. | 438/614 |
| 2007/0141750 A1 * | 6/2007 | Iwasaki et al. | 438/108 |
| 2007/0234563 A1 * | 10/2007 | Sakaguchi et al. | 29/843 |
| 2008/0003805 A1 * | 1/2008 | Pang et al. | 438/613 |
| 2008/0284048 A1 * | 11/2008 | Kim et al. | 257/797 |
| 2011/0291259 A9 * | 12/2011 | Huang et al. | 257/737 |

FOREIGN PATENT DOCUMENTS

| | | |
|---|---|---|
| JP | 2001007155 | 1/2001 |
| JP | 2004335660 | 11/2004 |
| JP | 2005217264 | 8/2005 |
| JP | 2007096198 | 4/2007 |
| JP | 2007281369 | 10/2007 |
| JP | 2008-227355 | 9/2008 |
| JP | 2009038266 | 2/2009 |

OTHER PUBLICATIONS

Japanese Office Action issued in corresponding JP Application No. 2009-133400 on Aug. 27, 2013, along with English translation thereof.

* cited by examiner

ELECTRONIC COMPONENT AND METHOD OF CONNECTING WITH MULTI-PROFILE BUMPS

CROSS-REFERENCE TO RELATED APPLICATIONS

This application is based upon and claims the benefit of priority from the prior Japanese Patent Application No. 2009-133400, filed on Jun. 2, 2009; the entire contents of which are incorporated herein by reference.

BACKGROUND OF THE INVENTION

1. Field of the Invention

The present invention relates to an electronic component and a manufacturing method thereof.

2. Description of the Related Art

In order to achieve downsizing and sophistication of semiconductor devices, there exists a practical application of a package structure (known as a chip-on-chip (COC) structure) in which a plurality of semiconductor chips are stacked and sealed inside a single package. A COC package is applied in a structure having logical elements and high-capacity memory chips stacked together. Moreover, research is being pursued toward the practical application of a COC package as a system-in-package (SiP) type semiconductor device. Meanwhile, regarding the connection between stacked semiconductor chips, application of flip-chip interconnection is being examined with the object of increasing the speed of data transmission (e.g., see Japanese Patent Application Laid-open No. 2009-38266).

As a stacked type semiconductor device, there exists a configuration in which a first semiconductor chip is bonded using an adhesive agent to the top face of an interconnection substrate having pads and solder balls arranged on the bottom face thereof and a second semiconductor chip is mounted on the first semiconductor chip. Land electrodes are arranged on the periphery of the top face of the interconnection substrate, and connected to first pads arranged on the periphery of the top face of the first semiconductor chip by a wire bonding. Bumps are formed on the bottom face of the second semiconductor chip, and connected to second pads formed on the top face of the first semiconductor chip by a flip-chip bonding. Between the first semiconductor chip and the second semiconductor chip is filled an underfill material. Besides, the first semiconductor chip and the second semiconductor chip on the top face of the interconnection substrate are resin-sealed. In such a configuration, the use of flip-chip interconnection enables achieving reduction in the connection distance between the semiconductor chips. Hence, it becomes possible, for example, to increase the speed of data transmission between memory chips and logical elements.

Meanwhile, a semiconductor chip having thousands of bumps formed on the bottom face thereof has come into practical use in a SiP type semiconductor device. Such semiconductor chips including thousands of bumps are made to be increasingly thinner and the warpage thereof is causing occurrence of bumps that are not connectable with interconnection substrates or with other semiconductor chips. Thus, in regard to performing flip-chip interconnection with the use of bumps, a technology has been disclosed by which, even if a semiconductor chip has a warpage, the height of bumps is changed within the plane of the semiconductor chip in such a way that all of the bumps get connected (e.g., see Japanese Patent Application Laid-open No. 2004-335660). In this way, methods have been proposed in the past for resolving the issue of poor connection of bumps that is caused by the differences occurring in bump formation positions prior to flip-chip interconnection due to the warpage of a semiconductor chip. However, no particular consideration has been given to the issue of differences in the height of bumps occurring during bump formation.

BRIEF SUMMARY OF THE INVENTION

A manufacturing method of an electronic component that is connected to either one of an interconnection substrate and other electronic component via a conductive bump according to an embodiment of the present invention, the manufacturing method comprises: forming a metal layer on a principle face of the electronic component on which have been formed a pad made of a conductive material and a passivation film covering the principle face except a formation position of the pad; applying a resist on the metal layer and forming, by lithography technique, an opening corresponding to the formation position of the pad; forming, by plating technique, a bump metal layer on the metal layer inside the opening; removing the resist; removing, by etching technique, the metal layer using the bump metal layer as a mask; and forming a bump by subjecting the bump metal layer to a reflow treatment, wherein the forming the opening comprises reducing radius of the opening at a bump formation position to such an extent that arrangement density of surrounding other bumps becomes sparse, and the forming the bump metal layer comprises forming the bump metal layer that has thickness smaller than radius of the opening.

A manufacturing method of an electronic component that is connected to either one of an interconnection substrate and other electronic component via a conductive bump according to an embodiment of the present invention, the manufacturing method comprises: forming a metal layer on a principle face of the electronic component on which have been formed a pad and a passivation film, the pad being made of a conductive material and being arranged in a first bump formation region that is two-dimensionally arranged in center of the principle face and in a second bump formation region that is linearly arranged at peripheral border of the principle face, the passivation film covering the principle face except a formation position of the pad; applying a resist on the metal layer and forming, by lithography technique, an opening corresponding to the formation position of the pad; forming, by plating technique, a bump metal layer on the metal layer inside the opening; removing the resist; removing, by etching technique, the metal layer using the bump metal layer as a mask; and forming a bump by subjecting the bump metal layer to reflow treatment, wherein the forming the opening comprises forming the opening at the second bump formation region with radius that is smaller than radius of at least some of the openings at the first bump formation region, and the forming the bump metal comprises forming the bump metal layer that has thickness smaller than radius of the opening.

An electronic component in which an element is formed on a chip according to an embodiment of the present invention, the electronic component comprises: a pad that is made of a conductive material and that is formed in a first bump formation region that is two-dimensionally arranged in center of one principle face and in a second bump formation region that is linearly arranged at peripheral border of the principle face; a passivation film that is formed on the principle face to cover portion except a formation position of the pad; a metal layer that is formed on the pad; and a bump that is made of a conductive material and that is formed on the metal layer by plating, wherein radius of the metal layer in the second bump formation region is smaller than radius of at least some of the metal layer in the first bump formation region.

DETAILED DESCRIPTION OF THE INVENTION

An exemplary embodiment of an electronic component and a manufacturing method thereof according to the present invention are described in detail below with reference to the accompanying drawings. The present invention is not limited to the exemplary embodiment. Moreover, the cross-sectional views illustrated in the following embodiments are only schematic and it is to be understood that the relation between thickness and width of layers or the ratio of thickness of each layer is different than the actual values. Furthermore, film thicknesses mentioned below are only exemplary and are not limited to those values.

Figure 1:
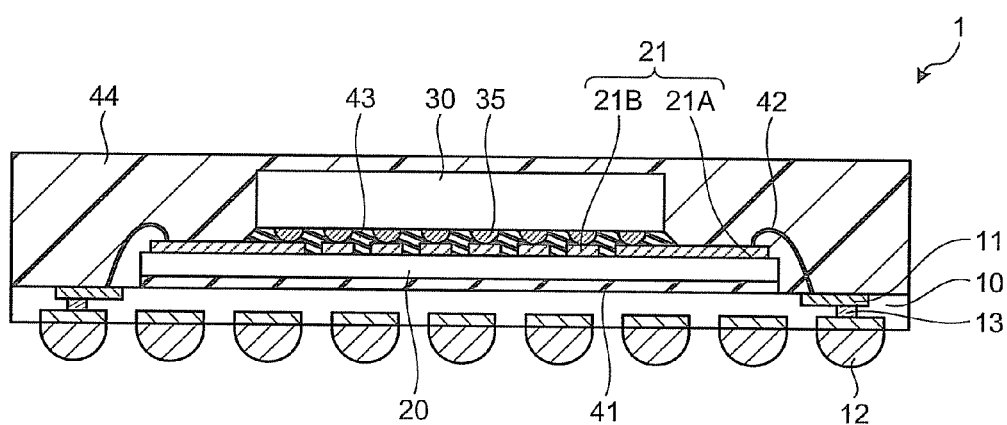
FIG. 1 is a schematic cross-sectional view of an exemplary configuration of an electronic component device according to an embodiment of the present invention.

FIG. 1 is a schematic cross-sectional view of an exemplary configuration of an electronic component device. Herein, as an example of the electronic component device, the description is given for a stacked type semiconductor device 1 that is an Sip type semiconductor device. The stacked type semiconductor device 1 includes an interconnection substrate 10 that functions as an interposer and a first semiconductor chip 20 and a second semiconductor chip 30 that are stacked in sequence as electronic components on the interconnection substrate 10.

The interconnection substrate 10 is a substrate on which semiconductor chips can be mounted and that includes a wiring network. The interconnection substrate 10 can be manufactured by designing a wiring network of inner layer wiring and outer layer wiring on an insulated substrate such as a resin substrate, a ceramic substrate, or a glass substrate or on a semiconductor substrate of silicon or the like. A typical example of the interconnection substrate 10 made of resin substrate is a printed wiring board.

Near the center on the top face side of the interconnection substrate 10, the first semiconductor chip 20 is mounted, while on the periphery of the top face of the interconnection substrate 10, connection pads 11 for establishing electrical connection with the first semiconductor chip 20 are arranged. On the bottom face side of the interconnection substrate 10, external connection terminals 12 such as solder balls are arranged. A wiring network 13 designed on the interconnection substrate 10 is used in establishing electrical connection with the connection pads 11 arranged on the periphery of the top face of the interconnection substrate 10 and with the external connection terminals 12 arranged on the bottom face of the interconnection substrate 10.

The first semiconductor chip 20 is mounted on a chip mounting part near the center on the top face side of the interconnection substrate 10 and is bonded with the interconnection substrate 10 by an adhesive layer 41. On the top face of the first semiconductor chip 20, electrode pads 21 are arranged. Meanwhile, the first semiconductor chip 20 is so mounted on the interconnection substrate 10 that the formation face (electrode formation face) of the electrode pads 21 faces upward. Unlike the interconnection substrate 10, the electrode pads 21 are formed over substantially the whole surface of the top face of the first semiconductor chip 20. The electrode pads 21 include a first group of pads 21A that is formed on the periphery of the top face and that is connected to the interconnection substrate 10 and a second group of pads 21B that is formed at the center of the top face and that is connected to the second semiconductor chip 30. The first group of pads 21A constitutes a wire bonding unit, while the second group of pads 21B constitutes a flip-chip interconnection unit. The first group of pads 21A is electrically connected to the connection pads 11 of the interconnection substrate 10 via conductive wires 42, which are metal thin wires such as common gold (Au) wires or common copper (Cu) wires.

The second semiconductor chip 30 is mounted on the first semiconductor chip 20 as a device chip including elements configured to perform predetermined functions. On the bottom face (principle face) side of the second semiconductor chip 30, a pad (not illustrated) to which bumps (solder bumps) 35 are connected are arranged. The bumps 35 can be made of copper (Cu)/tin (Sn). The bump formation positions of the bumps 35 on the second semiconductor chip 30 are aligned to the second group of pads 21B arranged on the top face of the first semiconductor chip 20. The bumps 35 and the second group of pads 21B are connected with flip-chip interconnection. Meanwhile, the clearance gap between the first semiconductor chip 20 and the second semiconductor chip 30 is filled with resin 43 as an underfill material. Meanwhile, it is possible to use a thermosetting resin such as epoxy resin, phenolic resin, or silicone resin as the resin 43.

The first semiconductor chip 20 and the second semiconductor chip 30, which are stacked and mounted on the interconnection substrate 10, are sealed by encapsulation resin 44 such as epoxy resin along with the conductive wire 42 to constitute the stacked type semiconductor device 1.

Figure 2A:
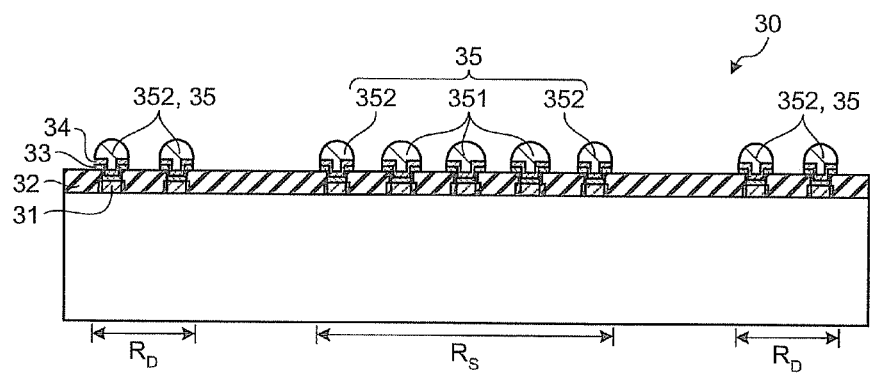
FIG. 2A is a partial cross-sectional view of an exemplary electrode formation face of a second semiconductor chip.
Figure 2B:
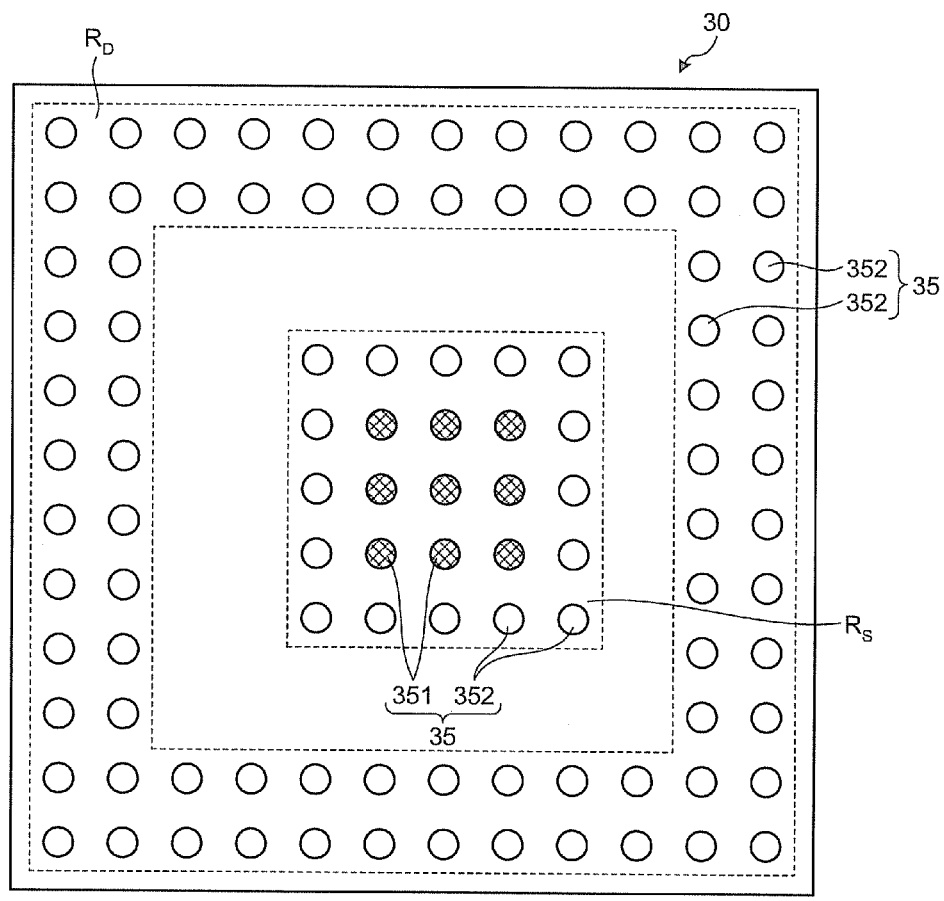
FIG. 2B is a rear view of the electrode formation face of the second semiconductor chip.

FIGS. 2A and 2B are schematic diagrams of an exemplary electrode formation face of the second semiconductor chip 30. FIG. 2A is a partial cross-sectional view of the electrode formation face of the second semiconductor chip 30, and FIG. 2B is a rear view of the electrode formation face of the second semiconductor chip 30. In FIGS. 2A and 2B, a post-reflow-treatment condition of the bumps is illustrated. Meanwhile, FIGS. 2A and 2B are only schematic diagrams and do not illustrate the actual number of bumps or the actual arrangement thereof.

As illustrated in FIG. 2A, on the principle face of the second semiconductor chip 30, pads 31 that have a predetermined shape and that are made of a conductive material such as aluminum, and a passivation film 32 that is made of a silicon nitride film for covering the principle face in entirety except the formation position of the pads 31 are formed. On the pad 31 and the surrounding passivation film 32, a barrier metal layer 33 made of stacked films of titanium (Ti) and copper (Cu) and a barrier layer 34 made of nickel (Ni) are stacked in sequence. On the barrier layer 34, the bumps (solder bumps) 35 made of copper (Cu)/tin (Sn) are formed. The titanium (Ti) film in the barrier metal layer 33 has the role of enhancing the adhesiveness between the pad 31 and the copper (Cu) film, while the copper (Cu) film functions as a conducting layer at the time forming a barrier metal layer by plating. The barrier layer 34 has the role of preventing mutual diffusion between the bumps 35 and the barrier metal layer 33.

As illustrated in FIG. 2B, among the plurality of bumps 35 formed on the principle face of the second semiconductor chip 30, the bumps 35 formed in a region $R_D$ that is close to the peripheral border of the principle face function as, for example, power bumps and the bumps 35 formed in a region $R_S$ that is close to the center of the principle face function as, for example, signal bumps. Generally, the power bumps include the bumps 35 in one to two rows along the periphery of the principle face of the second semiconductor chip 30, while the signal bumps include a group of bumps including a plurality of bumps 35 that are densely arranged in two-dimensional manner.

Depending on the arrangement, the bumps 35 are classified into two types, namely, first-type bumps 351 that are densely-arranged bumps and second-type bumps 352 that are sparsely-arranged bumps. A first-type bump 351 refers to that bump 35 around which another bump 35 is densely arranged in a regular manner. For example, except the outermost signal bumps, the signal bumps illustrated in FIGS. 2A and 2B can be considered as the first-type bumps 351. Such first-type bumps 351 are illustrated with a hatched pattern in FIG. 2B for enabling differentiation from the second-type bumps 352 described later. Meanwhile, alternatively, a first-type bump 351 can also be defined as the bump 35 for which the ratio with the radius thereof and the distance between the bump 35 and the bump 35 which is adjacent to the corresponding bumps 35 is smaller than 1 to 2, or preferably is 1 to 1.

On the other hand, a second-type bump 352 refers to that bump 35 around which no other bump 35 is densely arranged in a regular manner. For example, the outermost signal bumps or the power bumps illustrated in FIGS. 2A and 2B can be considered as the second-type bumps 352. Thus, the second-type bumps 352 are the outermost bumps 35 from among the bumps 35 arranged in a regular manner. Alternatively, a second-type bump 352 can also be defined as the bump 35 for which the ratio with the radius thereof and the distance between the bump 35 and at least one of the bump 35 which is adjacent to the corresponding bumps 35 is equal to or greater than 1 to 2.

Figure 3A:
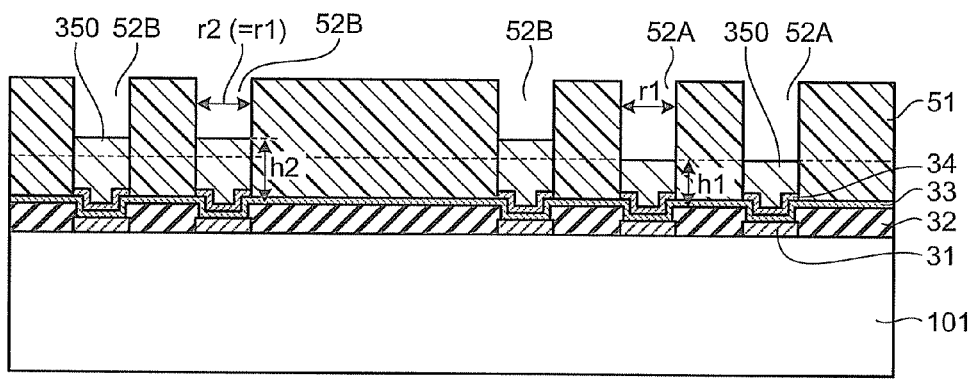
FIGS. 3A and 3B are cross-sectional views of a common condition of a bump metal layer at the time of plating and a common post-reflow-treatment condition of bumps.
Figure 3B:
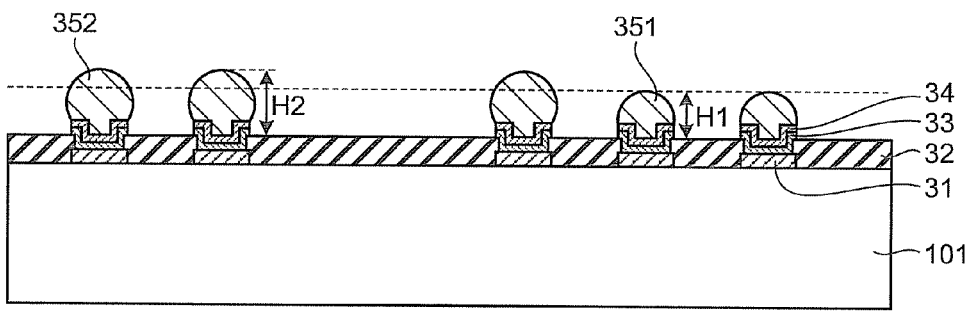

FIGS. 3A and 3B are cross-sectional views of a common condition of a bump metal layer at the time of plating and a common post-reflow-treatment condition of bumps. Firstly, as illustrated in FIG. 3A, in each first bump forming opening 52A and each second bump forming opening 52B in a resist mask 51 formed on the barrier metal layer 33, the barrier layer 34 and a bump metal layer 350 are formed by plating. During the plating process, the electric field applied to the sparsely-arranged second bump forming openings 52B is stronger than the electric field on the other portions. Hence, a film thickness h2 of the bump metal layer 350 formed in the second bump forming openings 52B is larger than a film thickness h1 of the bump metal layer 350 formed in the first bump forming openings 52A. Subsequently, the resist mask 51 is removed and, with the bump metal layer 350 as the mask, the barrier metal layer 33 is also removed except from the region around the position at which the pad 31 is formed. Then, the reflow treatment is performed so that the first-type bumps 351 and the second-type bumps 352 are formed as illustrated in FIG. 3B.

Herein, as illustrated in FIG. 3A, a radius r1 of the first bump forming openings 52A that are used in forming the densely-arranged first-type bumps 351 is set to be equal to a radius r2 of the second bump forming openings 52B that are used in forming the sparsely-arranged second-type bumps 352. When the reflow treatment is performed under such a condition, then, as illustrated in FIG. 3B, a height H2 of the second-type bumps 352 with the thicker bump metal layer 350 is larger than a height H1 of the first-type bumps 351.

If flip-chip interconnection is performed with respect to an electronic component including the first-type bumps 351 and the second-type bumps 352 of different heights as illustrated in FIG. 3B, then, due to the difference in the heights of the first-type bumps 351 and the second-type bumps 352, the first-type bumps 351 having the lower height do not get connected to the pad of the interconnection substrate or another electronic component.

Figure 4A:
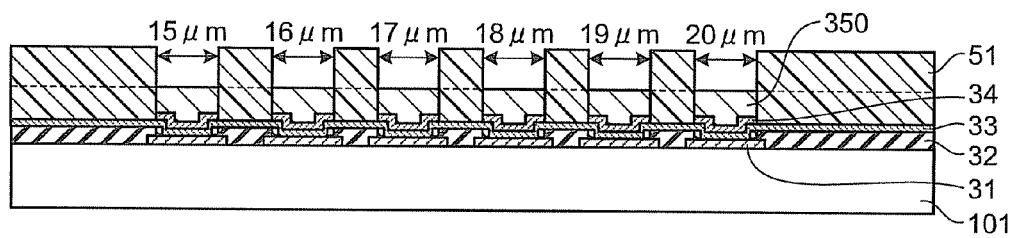
FIGS. 4A and 4B are cross-sectional views of another condition of the bump metal layer at the time of plating and another post-reflow-treatment condition of bumps.
Figure 4B:
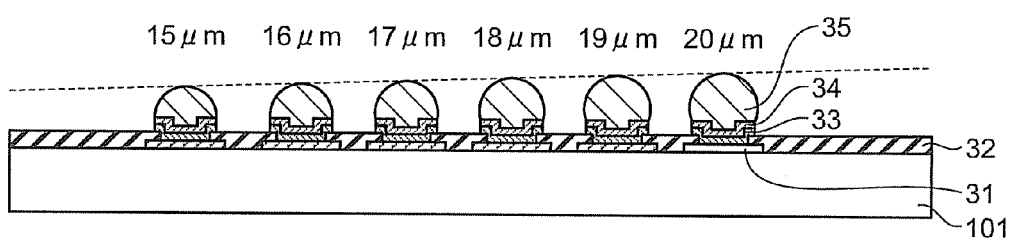

In regard to such a problem, the inventors of the present invention performed an experiment of forming a bump metal layer in each bump forming opening with different radii in the resist mask so that heights (thicknesses) of the each bump metal layer in each bump forming opening equals and then carrying out the reflow treatment of the bump metal layer. FIGS. 4A and 4B are cross-sectional views of another condition of the bump metal layer at the time of plating and another post-reflow-treatment condition of bumps. As illustrated in FIG. 4A, the bump metal layer 350 was formed in such a way that the bump forming openings had radii of 15 μm, 16 μm, 17 μm, 18 μm, 19 μm, and 20 μm, respectively, and the height of the bump metal layer 350 is 10 μm. When the reflow treatment was performed on the bump metal layer 350, then, as illustrated in FIG. 4B, it was found that smaller the radius of the bump forming openings, lower is the height of the post-reflow-treatment bumps 35.

However, such a condition occurs only if a thickness h of the bump metal layer 350 is smaller than a radius r of the bump forming openings. In contrast, if the thickness h of the bump metal layer 350 is equal to or greater than the radius r of the bump forming openings, then, due to the reflow treatment, the surface area of bumps approaches the smallest spherical shape and widens in the horizontal direction. Thus, after the reflow treatment is performed, there is a possibility that the bump metal layer 350 having the bump forming openings of a larger radius are formed at a lower height than the bump metal layer 350 having the bump forming openings of a smaller radius. Hence, there is no certainty that the result illustrated in FIG. 4B is obtained. Moreover, if, due to the reflow treatment, the bumps widen in the horizontal direction to become spherical in shape, then it becomes necessary to secure a margin for eliminating the possibility of contact between adjacent bumps. That hinders the object of downsizing the electronic component. To prevent such problems, according to the present embodiment, the thickness h of the bump metal layer 350 is set to be smaller than the radius r of the bump forming openings.

Figure 5A:
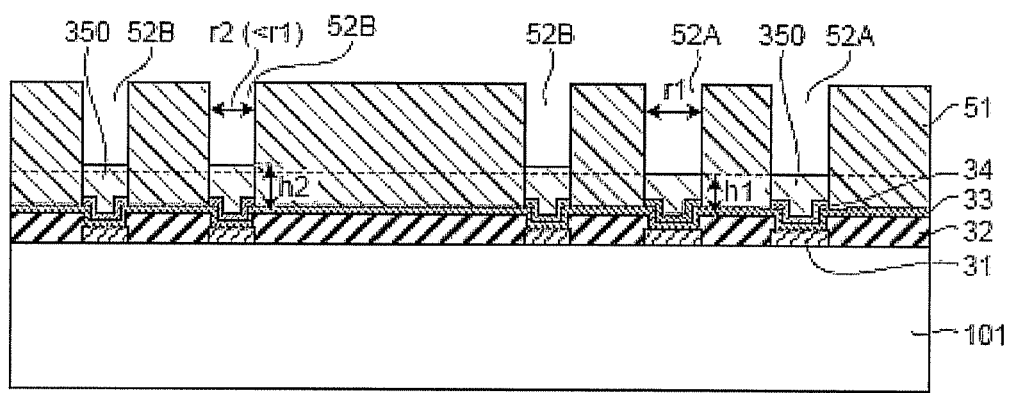
FIGS. 5A and 5B are cross-sectional views of a condition of the bump metal layer at the time of plating performed according to the present embodiment and the post-reflow-treatment condition of bumps according to the present embodiment.
Figure 5B:
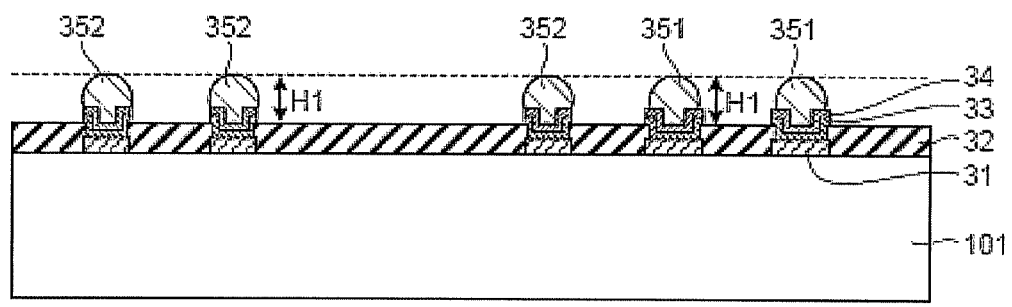

Accordingly, while maintaining the thickness h of the bump metal layer 350 smaller than the radius r of the bump forming openings, if the thickness of the bump metal layer 350 having the bump forming openings of a smaller radius is increased to more than the thickness of the bump metal layer 350 having the bump forming openings of a larger radius, then there are times when the post-reflow-treatment bumps in the two bump metal layers 350 have same heights. Thus, in the present embodiment, the thickness h of the bump metal layer 350 is maintained smaller than the radius r of the bump forming openings, while the radius of the second bump forming openings 52B is maintained smaller than the radius of the first bump forming openings 52A. FIGS. 5A and 5B are cross-sectional views of a condition of the bump metal layer at the time of plating performed according to the present embodiment and the post-reflow-treatment condition of bumps according to the present embodiment. As illustrated in FIG. 5A, the radius r2 of the sparsely-arranged second bump forming openings 52B is smaller than the radius r1 of the densely-arranged first bump forming openings 52A. Moreover, as described above, the electric field applied to the second bump forming openings 52B during the plating process is stronger than the electric field applied to the first bump forming openings 52A. Hence, the film thickness h2 of the bump metal layer 350 formed in the second bump forming openings 52B is larger than the film thickness h1 of the bump metal layer 350 formed in the first bump forming openings 52A. The film thickness h2 illustrated in FIG. 5A is identical to, for example, the film thickness h2 of the bump metal layer 350 formed in the second bump forming openings 52B as illustrated in FIG. 3A. The second bump forming openings 52B illustrated in FIG. 5A have a smaller radius r2 than the second bump forming openings 52B illustrated in FIG. 3A, and the height h2 of the bump metal layer 350 illustrated in FIG. 3A have the same height as the bump metal layer 350 illustrated in FIG. 5A. Consequently, after performing the reflow treatment, the height of the second bump becomes substantially equal to the height as illustrated in FIG. 5B. That enables achieving reduction in the size differences of the bumps 35.

That is, as illustrated in FIG. 2, the radius of the barrier metal layer 33 on which the second-type bumps 352 is formed is smaller than the radius of the barrier metal layer 33 on which the first-type bumps 351 is formed. For example, the radius of the barrier metal layer 33 under the first-type bumps 351 is 20 μm, and the radius of the barrier metal layer 33 under the second-type bumps 352 is 18 μm. Thus, by maintaining the radius of the barrier metal layer 33 on which the sparsely-arranged second-type bumps 352 are formed smaller than the radius of the barrier metal layer 33 on which the densely-arranged first-type bumps 351 are formed, the height of the post-reflow-treatment bumps 35 can be controlled at a substantially uniform level.

Given below is the description of a manufacturing method of such an electronic component. FIGS. 6A to 6G are cross-sectional views of an exemplary sequence of operations in a manufacturing method of the electronic component according to the present embodiment. To start with, on the principle face of a substrate 101, which is a silicon substrate on which has been formed a field-effect transistor (not illustrated) or wiring (not illustrated), an aluminum film is firstly formed and then formed the pad 31 having a predetermined shape using the photolithography technique and the etching technique. Moreover, on the principle face on which the pad 31 is formed, the passivation film 32 made of silicon nitride film is formed using the chemical vapor deposition (CVD) method. Then, using the photolithography technique and the etching technique, the passivation film 32 is removed only from the position at which the pad 31 is formed so that the surface of the pad 31 gets exposed (see FIG. 6A).

Figure 6A:
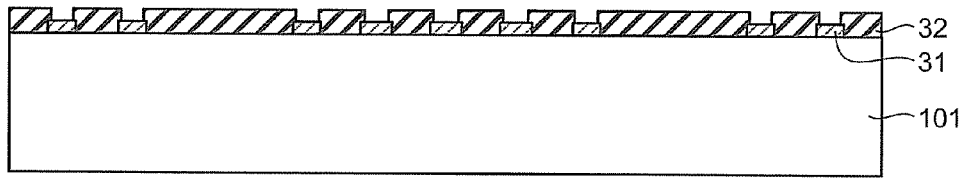
FIGS. 6A to 6G are cross-sectional views of an exemplary sequence of operations in a manufacturing method of an electronic component according to the present embodiment.
Figure 6B:
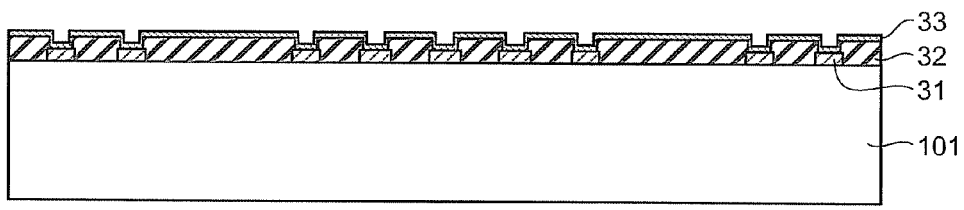

Subsequently, the barrier metal layer 33 is formed on the pad 31 and the passivation film 32 (see FIG. 6B). For example, the barrier metal layer 33 is formed by stacking a titanium (Ti) film of 200 nm and a copper (Cu) film of 300 nm using a film formation technique such as the sputtering method or the evaporation method.

Figure 6C:
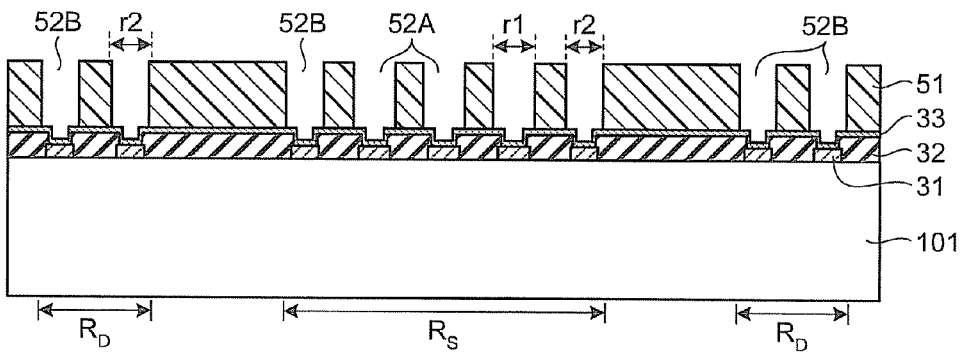
Figure 6D:
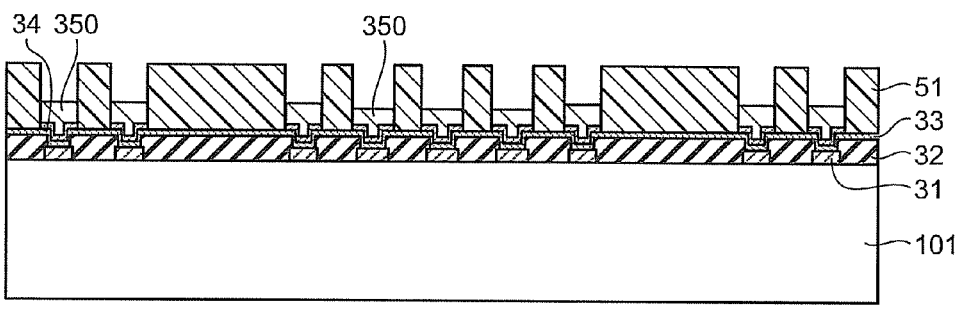
Figure 6E:
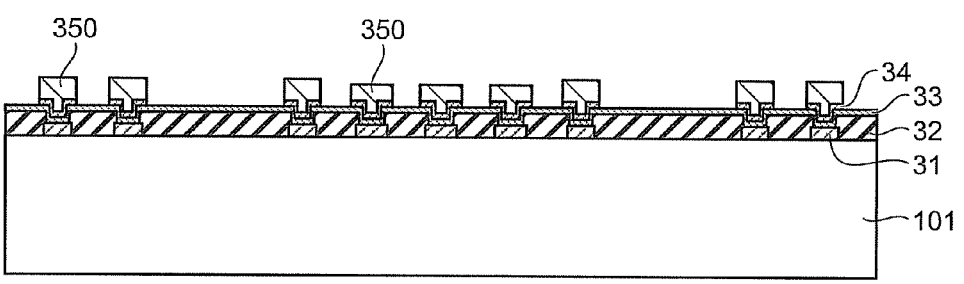

Then, a resist is applied on the barrier metal layer 33, the resist mask 51 is formed therefrom using the photolithography technique, and lithographic exposure and development is performed so that the bump forming openings 52A and 52B are formed at the respective bump formation positions on the resist mask 51 (see FIG. 6C). At that time, the radius r2 of the second bump forming openings 52B, which correspond to the bump formation positions of the second-type bumps 352 (the outermost bumps in the signal bump forming region $R_S$ and the bumps in the power bump forming region $R_D$), is maintained smaller by a predetermined amount than the radius r1 of the first bump forming openings 52A, which correspond to the bump formation positions of the first-type bumps 351 (the bumps in the signal bump forming region $R_S$ except the outermost bumps). For example, when the radius r1 of the first bump forming openings 52A is 20 μm, the radius r2 of the first bump forming openings 52A is maintained at 18 μm.

Subsequently, electricity is conducted through the copper (Cu) film of the barrier metal layer 33 in a plating solution by performing, for example, electrolytic plating. Because of that, the barrier layer 34 and the bump metal layer 350 for forming bumps are formed on the barrier metal layer 33 inside each of the first bump forming openings 52A and on the barrier metal layer 33 inside each of the second bump forming openings 52B formed on the resist mask 51 (see FIG. 6D). Herein, a nickel (Ni) film of 5 μm to 6 μm is formed as the barrier layer 34, while a copper (Cu) film of 0.35 μm to 0.50 μm and a tin (Sn) film of 6 μm to 7 μm are formed in sequence as the bump metal layer 350. At that time, the plating time is controlled so that the film thickness of the barrier layer 34 and the bump metal layer 350 is maintained at a predetermined thickness. Meanwhile, the present embodiment is intended for the case when the thickness of the bump metal layer 350 is smaller than the radius of the bump forming openings 52A and 52B.

Figure 6F:
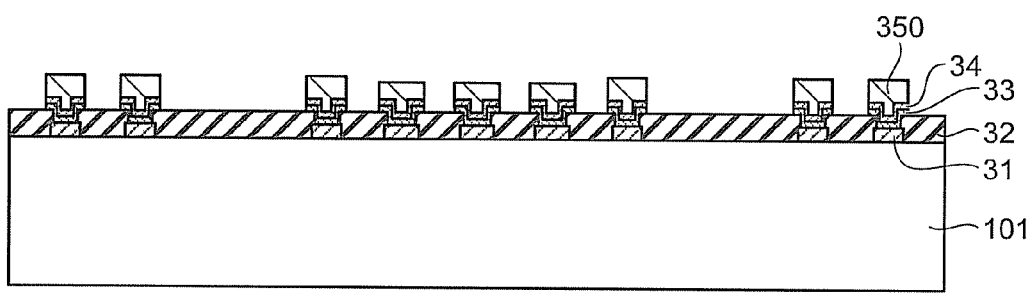

Subsequently, the resist mask 51 is removed by performing ashing or the like (see FIG. 6E) and, with the bump metal layer 350 as the mask, the barrier metal layer 33 is also removed using the etching technique from the region on which the bump metal layer 350 is not formed (see FIG. 6F).

Figure 6G:
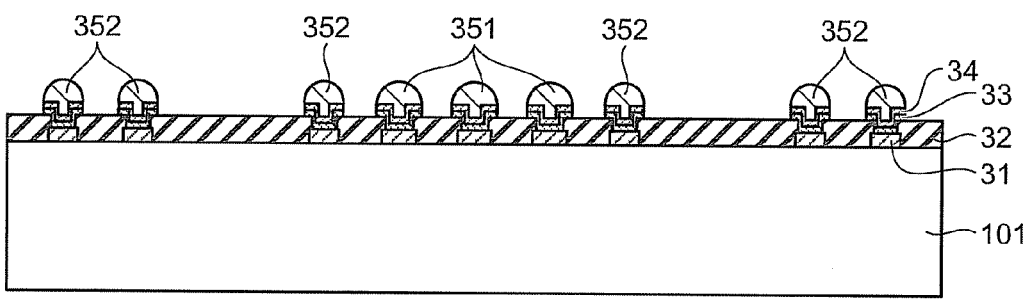

Then, the bump metal layer 350 is covered by applying a flux (not illustrated) and subjected to heat treatment in a nitrogen reflow furnace for forming the first-type bumps 351 and the second-type bumps 352 on the melting bump metal layer 350 (see FIG. 6G). Then, the flux is removed with the use of, for example, an organic solvent of glycol ether series. As a result, the electronic component can be obtained in which all of the bumps 351 and 352 formed on the principle face of the substrate 101 are of a uniform height.

Subsequently, for example, the substrate 101 is diced with a dicer to make a device chip, stacked with an interconnection substrate or another electronic component, and subjected to pressure while being heated so that an electronic component of flip-chip interconnection type is obtained.

Meanwhile, in the abovementioned description, electrolyte plating is performed for forming the barrier layer 34 inside the first bump forming openings 52A and the second bump forming openings 52B on the resist mask 51. Alternatively, the sputtering method or the evaporation method can be used to form the barrier layer 34 on the barrier metal layer 33 immediately after forming the barrier metal layer 33 but before forming the resist mask 51.

Moreover, in the abovementioned description, a semiconductor chip constituting a stacked type semiconductor device is explained as an example of the electronic component. However, the present invention is not limited to that case and can also be applied to a general electronic component in which the bump metal layer 350 formed by plating is subjected to the reflow treatment for forming the bumps 35.

Furthermore, in the abovementioned description, the bump forming openings have two different radii. Instead, the bump forming openings can also have three radii or more.

To sum up, according to the present embodiment, the radius r2 of the sparsely-arranged second bump forming openings 52B is maintained smaller than the radius r1 of the densely-arranged first bump forming openings 52A and the bump metal layer 350 is formed by plating. Hence, it becomes possible to prevent the occurrence of a conventional problem in which the post-reflow-treatment bumps have different heights due to the fact that the bump metal layer 350 at the sparsely-arranged bump forming openings with a stronger electric field thereon has a larger thickness as compared to the bump metal layer 350 at the other portions. Thus, it is possible to eliminate the problem of height differences among the bumps 35 that occurs during the process of forming the bumps 35 in an electronic component. As a result, it becomes possible to achieve excellent robustness in the connection with an interconnection substrate or another electronic component. Moreover, while forming the bumps 35 by performing the reflow treatment on the bump metal layer 350, it is possible to prevent widening of the bumps 35 in the horizontal direction. That helps in achieving downsizing of the electronic component.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A forming method of bumps that is connected to either one of an interconnection substrate and other electronic component via a conductive bump, the manufacturing method comprising:

forming a metal layer on a principle face of the electronic component on which have been formed a first pad, a second pad and a passivation film, the first pad being made of a conductive material and being two-dimensionally arranged in center region of the principle face, the second pad being made of a conductive material and being linearly arranged at peripheral border region of the principle face, the passivation film covering the principle face except a formation position of the pad;

applying a resist on the metal layer and forming, by lithography technique, an opening corresponding to the formation position of the first and second pad;

forming, by plating technique, a bump metal layer on the metal layer inside the opening;

removing the resist;

removing, by etching technique, the metal layer using the bump metal layer as a mask; and forming a bump by subjecting the bump metal layer to reflow treatment, wherein the forming the opening comprises forming the opening at the peripheral border region with radius that is smaller than radius of at least some of the openings at the center region, the forming the bump metal comprises forming the bump metal layer that has thickness smaller than radius of the opening, and in the forming of the bump, the reflow treatment is performed so that a difference in height between the bumps in the center region and the bumps in the peripheral border region becomes small.

2. The forming method according to claim 1, wherein the forming the opening comprises setting radius of the opening at the center region and radius of the opening at the peripheral border region in such a way that the bump has uniform height after the reflow treatment is performed.

3. The forming method according to claim 1, wherein the forming the opening comprises setting a radius of a first opening is larger than a radius of a second opening, wherein the first opening is formed at a bump formation position at which a ratio of the radius of a bump and a distance between the bump and other bumps which are adjacent to the bump is smaller than 1 to 2 in the center region, and the second opening is formed at the peripheral border region and at a bump formation position at which a ratio of the radius of a bump and a distance between the bump and at least one of other bumps which are adjacent to the bump is equal to or greater than 1 to 2 in the center region.

4. The forming method according to claim 1, wherein the metal layer is selected to function as at least one of a conductive layer at time of performing plating on the bump metal layer, a barrier metal film that enhances adhesiveness between the pad and the bump metal layer, and a barrier layer that prevents mutual diffusion between the pad and the bump metal layer.

5. The forming method according to claim 1, wherein the forming the metal layer comprises, in sequence, forming a barrier metal film that enhances adhesiveness between the pad and the bump metal layer, forming a conductive layer at time of performing plating on the bump metal layer, and forming a barrier layer that prevents mutual diffusion between the pad and the bump metal layer.

* * * * *